(12) United States Patent
Rafaila

(10) Patent No.: US 10,733,344 B2
(45) Date of Patent: Aug. 4, 2020

(54) METHOD OF SELECTING A PROVER

(71) Applicant: Onespin Solutions GmbH, Munich (DE)

(72) Inventor: Monica Rafaila, Munich (DE)

(73) Assignee: Onespin Solutions GmbH, Munich (DE)

( * ) Notice: Subject to any disclaimer, the term of this patent is extended or adjusted under 35 U.S.C. 154(b) by 214 days.

(21) Appl. No.: 15/790,339

(22) Filed: Oct. 23, 2017

(65) Prior Publication Data

US 2019/0121919 A1 Apr. 25, 2019

(51) Int. Cl.
*G06F 30/3323* (2020.01)
*G06N 20/00* (2019.01)
*G06F 11/36* (2006.01)

(52) U.S. Cl.
CPC ...... *G06F 30/3323* (2020.01); *G06F 11/3608* (2013.01); *G06N 20/00* (2019.01)

(58) Field of Classification Search
None
See application file for complete search history.

(56) References Cited

U.S. PATENT DOCUMENTS

| 2008/0147573 | A1* | 6/2008 | Hamadi | G06N 20/00 706/12 |
| 2014/0330758 | A1 | 11/2014 | Yu | |

OTHER PUBLICATIONS

Lindauer et al., "AutoFolio: An Automatically Configured Algorithm Selector", Journal of Artificial Intelligence Research 53 (2015), pp. 745-778 (Year: 2015).*
Prasad Mukul R. et al.. "A survey of recent advances in SAT-based formal verification," International Journal of Software Tools for Technology Transfer, vol. 7, No. 2 pp. 156-173 (2005).
Bischl Bernd et al., "ASlib: A benchmark library for algorithm selection," Artificial Intelligence, vol. 237, pp. 41-58 (Apr. 8, 2016).
Marius Lindauer et al., "AutoFolio: An Automatically Configured Algorithm Selector," Journal of Artificial Intelligence Research, pp. 745-778 (Aug. 1, 2015).
Georgia Penido Safe et al., "Selection of Formal Verification Heuristics for Parallel Execution," Int J Softw Tools Technol Transfer (2012) 14: 95.
Ian Gent et al., "Machine learning for constraint solver design", University of St Andrews (2010).

(Continued)

*Primary Examiner* — Jack Chiang
*Assistant Examiner* — Aric Lin
(74) *Attorney, Agent, or Firm* — 24IP Law Group USA, PLLC; Timothy R. DeWitt

(57) ABSTRACT

A computer implemented method of selecting a prover among a plurality of provers for a design to be verified. The method comprises collecting, by a data module, raw data relating to the design, and extracting from the raw data a plurality of input features, transforming, by a transformer module, the plurality of input features, wherein transforming the plurality of features comprises applying a linear regression to the plurality of features, classifying using a classification module, the provers from the plurality of provers, in which the classification module is adapted to predict a best prover being the prover which solves a property faster than the remaining provers of the plurality of provers, selecting one or more provers based on the results of the classification.

12 Claims, 9 Drawing Sheets

(56) References Cited

OTHER PUBLICATIONS

Oezlem Karaca et al., "Fault Grouping for Fault Injection Based Simulation", 2016 IEEE 13th International Conference on Synthesis, Modeling, Analysis and Simulation Methods and Applications to Circuit Design (SMACD).

Oezlem Karaca et al., "Estimation of Formal Verification Cost Using RegressionMachine Learning", 2016 IEEE International High Level Design Validation and Test Workshop (HLDVT).

Lars Buitinck, Gilles Louppe, Mathieu Blondel, Fabian Pedregosa, Andreas Mueller, et al., "API design for machine learning software: experiences from the scikit-learn project," European Conference on Machine Learning and Principles and Practices of Knowledge Discovery in Databases, Sep. 2013, Prague, Czech Republic. 2013.

Yoav Freund, "A Black-Box approach to machine learning," PowerPoint (2000).

* cited by examiner

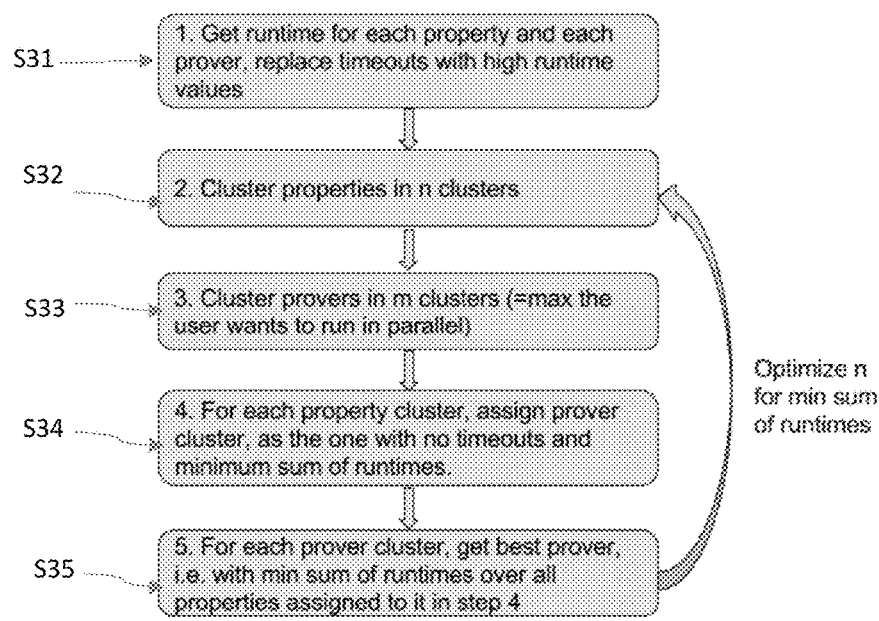
Fig. 10
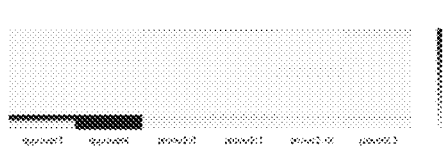
Fig. 11
| Cluster properties (size) \ Cluster provers | Cluster 1 prover2:0 prover2:1 prover2:12 prover2:3 | Cluster 2 approver3 | Cluster 3 approver4 |
|---|---|---|---|
| 1 (3 properties) | 37s | 3s | 1s |
| 2 (99 properties) | 35s | 46s | 67s |
| 3 (6 properties) | 54s | NA | NA |
| 4 (3 properties) | 17s | 452s | NA |
| 5 (9 properties) | 20s | 304s | NA |
Fig. 14

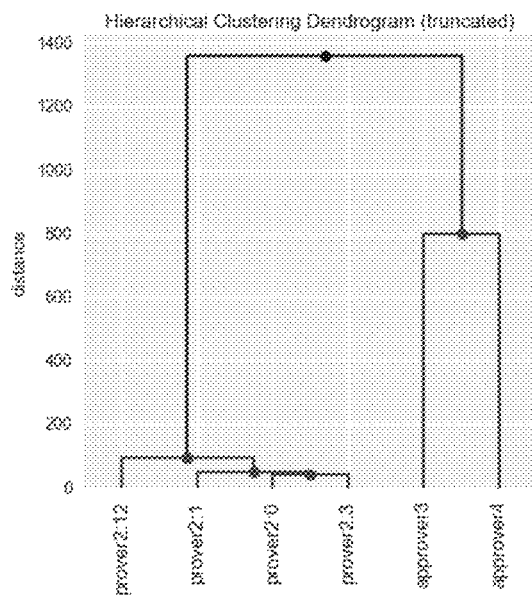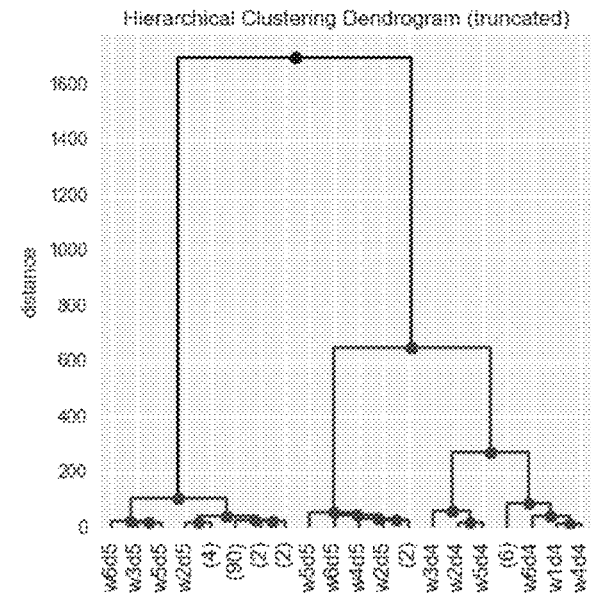
Fig. 12  Fig. 13
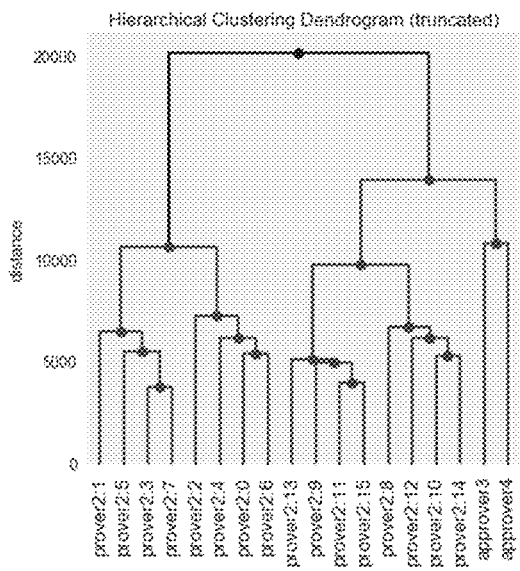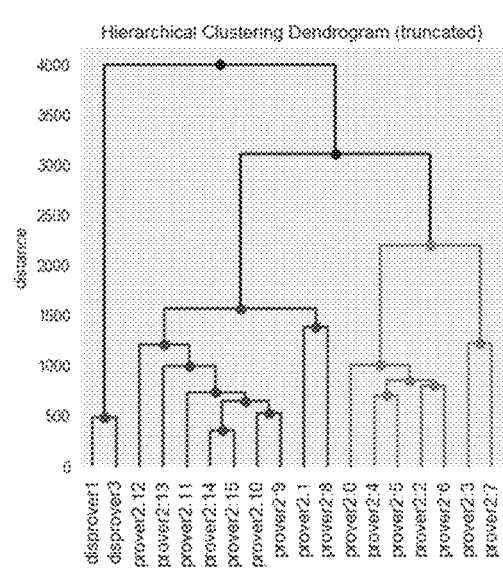
Fig. 15  Fig. 16

METHOD OF SELECTING A PROVER

CROSS-REFERENCE TO RELATED APPLICATIONS

None.

STATEMENT REGARDING FEDERALLY SPONSORED RESEARCH OR DEVELOPMENT

None.

BACKGROUND OF THE INVENTION

Field of the Invention

The present invention relates to formal verification, and more particularly, to a computer implemented method of selecting a prover among a plurality of provers for a design to be verified.

Brief Description of the Related Art

Formal verification applied for hardware or software verification is the act of proving or disproving the correctness of intended algorithms underlying a system with respect to a certain formal specification or property.

Verification engines uses different algorithms for formal verification, such as binary decision diagrams (BDD) based reachability, satisfiability (SAT) based bounded model checking (BMC), interpolations, and property-directed reachability (PDR). The verification engines check whether a certain state, e.g. an improper state or a valid state, can be reached from initial states. The verification engines can either prove the property that the improper state cannot be reached, or falsify the property with a trace connecting a valid initial state to the improper state.

A verification engine designed to prove that an improper state cannot be reached is referred to as a "prover".

Different verification engines may have drastically different performances on different problems depending on the verification algorithms used by the verification engines. Indeed, the ability to prove or disprove properties, as well as the resources and CPU time needed for the verification, vary significantly, depending on the verification engine, design and property.

Properties and designs may be described by a set of characteristics or features. For example, Design Control Points include design input, in-out ports, un-driven wires, the user-defined cut points. Another example are the Design Structural elements, such as the total number of design's counters, RAM. Yet another example is the Design States Complexity defining a total number of design states elements, including the total number of design latches and flip-flops. Another example is the Property Logical Complexity, comprising at least one of a sequential depth, a total number of Flip-Flops, Latches and combinational gates.

It is of interest to use these features to schedule the verification engines so as to maximize their probability to converge on the one hand, and to minimize the runtime on the other hand, to make an efficient use of CPU time.

An automated scheduling strategy for verification engines may be defined, in order to have a predictable and limited amount of resources invested for a set of designs/properties, i.e. run time (real time/CPU time), number of cores to run in parallel, memory consumption. The automated scheduling strategy may decide which verification engines or software to run, whether to run sequentially or in parallel, and how long to run (in terms of time, steps or Boolean Constraint Propagation (BCP) counts), for what type of property, on different designs.

In order to define an automated scheduling strategy, it is needed to select the selection engine or prover suitable for the given formal verification to be done. Prover parameter configuration is also needed to limit the time spent per check and allow subsequent checks to be reached. Provers can be configured by limiting the maximum number of steps, if available, or alternatively on the BCP counter.

State of the art approaches for verification engine selection are based mainly either on brute force or on verification engineers' feelings.

It has been proposed to use linear regression to estimate the CPU time based on design and property features. A regression model of the runtime vs. the design and property features, using LASSO, regularization, and compare against K Nearest Neighbors.

Machine learning is the subfield of computer science that gives computers the ability to learn without being explicitly programmed. Machine learning explores algorithms that can learn from and make predictions on data—such algorithms overcome following strictly static program instructions by making data-driven predictions or decisions, through building a model from sample inputs. Machine learning has been applied for integrated circuit verification, for e.g. to cope with process variations in semiconductor production, for fault injection in the verification of safety-critical systems.

In machine learning, a pipeline is a sequential chain of operations, in particular of transformers and estimators, which is trained and after training in used to make predictions.

A first approach for the selection of verification engines for parallel execution has been proposed in which Principal Component Analysis (PCA) and linear regression are applied to estimate the time of four different engines. PCA is a statistical procedure known in the field of machine learning, which uses an orthogonal transformation to convert a set of observations of possibly correlated variables into a set of values of linearly uncorrelated variables called principal components. In this approach, both polynomial and exponential transformations of features are used, afterwards a performance function is defined and a weight per engine is calculated which correlates to the engine runtime. The correlation of selected engines is thereafter minimized.

Yet another approach applies classification to select a SAT solver, which performs optimally on the different constraint, based on attributes of the problem instances (i.e., to find the implementation which has the best performance in terms of search nodes per second). A meta-classifier is proposed, which combines multiple classification strategies for a resulting better one. A misclassification penalty is proposed, which corresponds to the additional CPU time required to solve a problem instance when choosing to solve it with a solver that is not the fastest one.

The patent application US 2014/0330758 discloses a method for training a classifier to create a prediction model. The approach described in the patent application US'758 relies on machine learning. More precisely, US'758 applies Support Vector Machine (SVM) classification to prover selection. Features can be collected by a BMC SAT solver, and include statistics for the CNF generated at the various steps of the BMC algorithm. The prediction model uses the feature data of the design verification problem to make a result prediction for the design verification model.

There is a need to improve the efficiency of a system and method for design verification.

One object of the invention is to provide a system and method for selecting a verification engine for design verification.

SUMMARY OF THE INVENTION

The present invention proposes a computer implemented method of selecting a prover among a plurality of provers for a design to be verified, comprising collecting, by a data module, raw data relating to the design, and extracting from the raw data a plurality of input features, transforming, by a transformer module, the plurality of input features, wherein transforming the plurality of features comprises applying a linear regression to the plurality of features, classifying using a classification module, the provers from the plurality of provers, in which the classification module is adapted to predict the best prover being the prover which solves a property faster than the remaining provers of the plurality of provers, and selecting one or more provers based on the results of the classification.

Therefore, the present invention proposes using a pipeline made from multiple transformers and estimators exported to online use in formal verification. Using the measured statistics describing each design and check or property allows using only the characteristics or the statistical behavior of the design and not the actual design to the prover selection module.

The invention is aiming at providing a machine learning based method and verification.

In an aspect of the invention, the step of extracting a plurality of features comprises the steps of extracting design parameters as input features for the transformer module.

In a further aspect of the invention, the transforming of the collected data may comprise removing cross correlation of the input features. Removing the cross correlation of input features comprises standardizing, by a standard scaler module, the input features of the plurality of features to a unit variance to standardized features, applying, by a principal component analysis module, an orthogonal transformation as a principal component analysis to the standardized features, and keeping the components resulting from the principal component analysis having a significant ratio of explained variance.

In an aspect of the invention, the classification module is pre-trained by collecting a set of training data pertaining to a set of designs, design parameters and runtimes for a plurality of provers, transforming the set of training data, and classifying the provers using the transformed set of training data.

The classifying step may comprise assigning, for a property, a probability to a prover using a multi class logistic regression based on design features and an expected result of the property.

In yet a further aspect of the invention, the method comprises configuring the provers of the plurality of provers using linear regression modelling dependency of a step size on the design and an expected time of the prover to check the assertion.

By providing a prover configuration, or prover parameter setting, it becomes possible to interrupt the provers when they reach the configured step size for a property, with the disadvantage that no meaningful result is reached for that property, but with the advantage that subsequent properties can be reached and provers don't spend too much time on this particular property. A constant step size for all designs is not good because it will be reached fast for some designs, with no meaningful result for many properties, and no big gain in time, while a large step size will determine a lot of time invested for some designs. Therefore a step size depending on the design features must be set. The prediction of the step size is realized after selecting the best prover and before running the prover.

A prover may be configured using a LASSO regression model having dependent variables and independent variables, in which the dependent variable of the regression model is a number of steps and the independent variable of the regression model are design statistics and expected check time.

In an aspect of the invention, the method comprises grouping provers in a plurality of prover groups and grouping properties in a plurality of properties, based on runtimes for each property and prover.

Surprisingly it has been found that clustering is a very powerful tool in providing the adequate automated selection among all options In an aspect of the invention, the method comprises assigning a prover group to a property group, in particular in which the assigned prover group of the plurality of prover groups has a minimum sum of runtimes. The method may further comprises selecting, for each assigned prover group, the prover of the prover group having the minimum runtimes over the properties of the property group to which the assigned prover group is assigned.

It should be noted applying clustering for prover grouping may have the advantage that it can generalize over unmeasured properties, under the assumption that there are representative properties in the data which was clustered. In this case, among the provers selected as optimal for the property clusters, there will be provers optimal for each type of check, i.e. for each type of property.

In an aspect of the invention, the method comprises running the selected provers from the assigned prover groups in parallel.

A computer program product comprising a non-transitory computer medium having stored therein to cause a computer to perform the steps of the above method of selecting a prover among a plurality of provers for a design to be verified.

A further benefit from the invention is that it becomes possible to extract statistical saviour data from a circuit or any other object to be verified such that the extracted data can be further analysed, treated and returned without including particular design information and thus not allowing any reverse engineering. Hence the method has proven to be very powerful in remote verification applications or for remote computing in general as the data are purely statistical data.

The scikit-learn Python libraries may be used to train and validate the pipeline.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 10 shows a method for selecting a prover according to the present invention.

FIG. 11 shows a plot of heatmap runtimes checks for different provers in accordance with a preferred embodiment of the present invention.

FIG. 12 shows a dendrogram of clusters of provers in accordance with a preferred embodiment of the present invention.

FIG. 13 shows another dendrogram of clusters of provers in accordance with a preferred embodiment of the present invention.

FIG. 14 shows a table of sum run times per pair of Cluster properties and cluster provers in accordance with a preferred embodiment of the invention.

FIG. 15 shows dendrograms of hierarchical clusters of provers in accordance with a preferred embodiment of the present invention.

FIG. 16 shows another example of dendrograms of hierarchical clusters of provers in accordance with a preferred embodiment of the present invention

DETAILED DESCRIPTION OF THE PREFERRED EMBODIMENTS

As will be explained, the present invention proposes a pipeline for online selection of provers, based on design and property parameters. A pipeline is a chained set of operations which can be fit and globally optimized. The pipeline proposed by the present invention comprises operations which standardize, transform the features, classify, rank and select best performing provers among a set of provers. The system and method of the present invention further predict a prover's step size corresponding to an expected runtime and configure the step size in order to limit the execution time. The grouping of provers is also described to minimize the runtime over a set of checks, based on runtimes of provers. The pipeline can be used for dynamic prediction on new designs, and optionally be trained again when data on new designs is available.

Figure 1A:
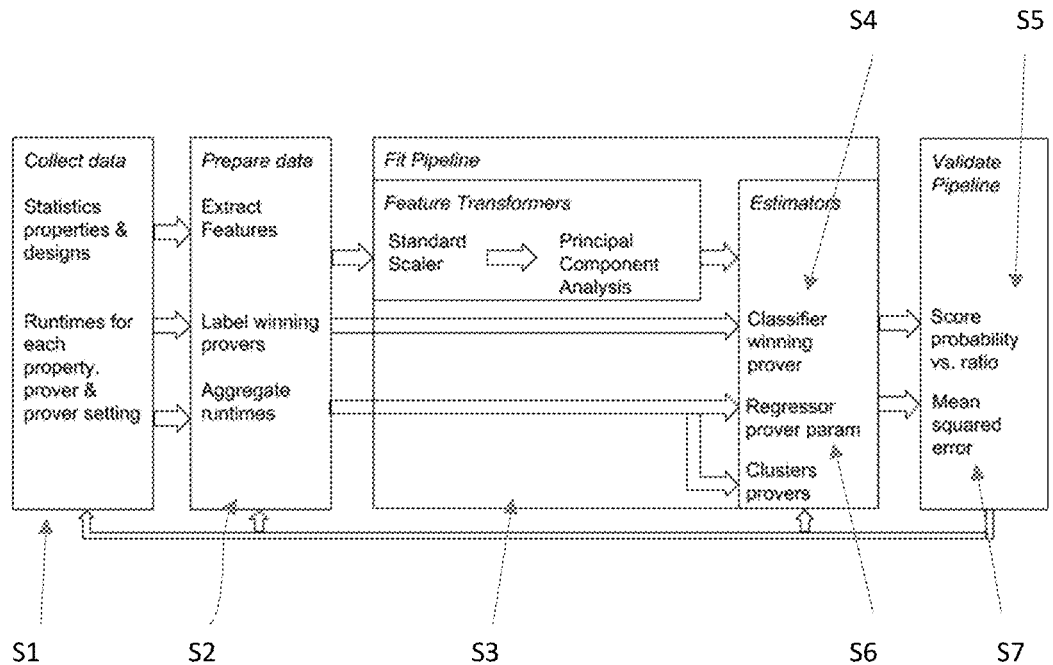
FIG. 1A is a diagram illustrating a method for building a pipeline.
Figure 1B:
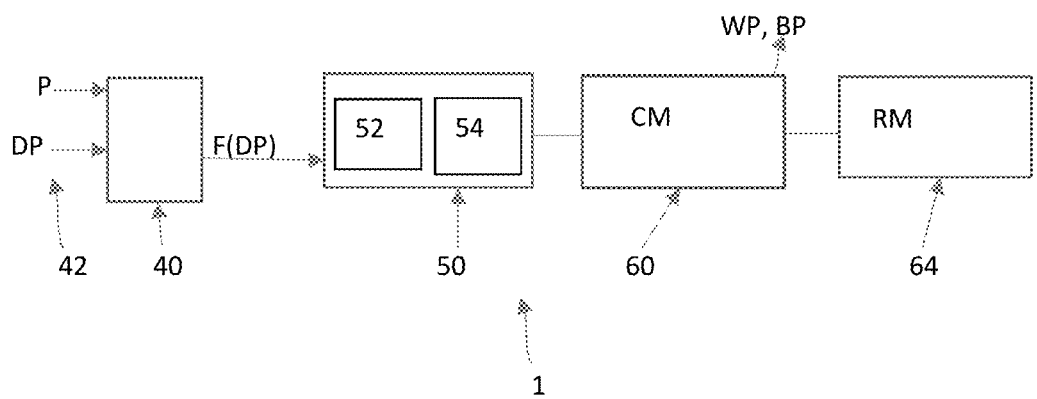
FIG. 1B is an overview of a system for building a pipeline in accordance with a preferred embodiment of the present invention.

A general architecture for a system and method for building a pipeline in accordance with a preferred embodiment of the present invention is shown in FIGS. 1A and 1B. The system includes a computing device 1, which may be a computer or server having one or more processors, a memory and a non-transitory storage medium such as a hard drive or solid state drive. The computing device 1 comprises a data module 40, a pipeline module 50, an estimation module 60 and a prover selection module 70.

The data module 40 is provided for collecting data used for building the pipeline. The data module 40 is provided for preparing data to be injected in the pipeline module 50. Collecting data is the first step S1 to build the pipeline.

Raw data 42 may comprise features of properties, features of designs, runtimes of each prover on each property, the result of the property—hold/fail, winning prover per property, and for each prover—the status, runtime and number of steps needed.

In the present invention, a predefined numbers of checks, i.e. of properties, from a set of designs D is ran to train and fit the pipeline, with a set of provers P. Each design of the set of designs D is characterized by a set of design parameters DP which may influence the design. In the example described, there are 1176 checks run from 10 designs. 6 provers were used and 42 design parameters were extracted from the design, for each design. The skilled person understands the number of checks, designs, provers and design parameters are only given as examples and are in no way limiting the invention.

The data module 40 is also adapted for preparing the raw data 42 to be injected into the pipeline module 40. This is the second step S2 of the method for building the pipeline. For each property, the winning provers WP among the set of provers P are labeled accordingly, if they converge within the shortest runtime compared to the rest of provers and if the difference is significant—e.g. bigger than 5 minutes. Runtimes may also be aggregated to be used as input for regression model and distance matrix for the hierarchical clustering.

It may happen that different provers solve specific properties in almost the same time, or because of different loads on the machines, there are small variations in the recorded runtime. To avoid labeling the winning prover in a random way, the labeling can account for the actual difference in solve time, and label as the winning provers only the ones which have a significantly faster result e.g. 5 minutes. If too much points lie in the "gray zone" another solution can be inverting the problem and labeling poor provers instead of winning provers, by poor we understand provers which take significantly longer, compared to the shortest known time to solve the property. In this case the prover selection will have to keep out of the selection the worst provers.

It should be noted that only the provers capable of finding respective results should be run for properties known to fail or hold.

Another manner to label the provers is to label them as fast or slow, compared to the fastest prover, instead as labeling the prover as a winning prover or not. This alternative labeling avoids the risk of labeling winning provers randomly when more provers are fast and close to each other, and also avoids labeling many samples as having no winning prover so no information, when more provers are fast—and some are slow—which is a piece of information worth modelling as well. Therefore, in some cases, it can be of interest to predict on a prover-level, whether is it is fast or slow, and this can be done with the above mentioned labeling scheme. An alternative is to use the same winning prover vs. losing prover labeling, as long as few significantly different provers are analyzed In machine learning, a feature is an individual measurable property of a phenomenon being observed. In the present invention, prover performance is a dependent variable of the machine learning, i.e. an output being modelled. The present invention also proposes extracting design parameters DP of the designs under test to be used as features. Therefore, the data module 40 outputs a set of features F, as using machine learning features.

In a preferred embodiment of the present invention, the pipeline module 50 is provided to fit (train) the pipeline. The fitting of the pipeline is done by running, by a transformer module 50, a succession of transformers, i.e. operators which may clean, reduce, expand or generate feature representations (at step S3), followed by an estimation, by a classification module 60, of the probability of each prover to solve a property, on the transformed features (step S4).

The transformer module 50 is adapted to standardize each feature from the set of features F to a unit variance. This can be done by a standard scaler 52, which allows improving the quality of the final estimation, by weighting equally the machine learning features of the set of features F (design parameters DP).

The output of the standard scaler module 52 is connected a principal Component Analysis module 54, adapted to apply PCA to the set of design parameters DP. Principal Component Analysis (PCA) is a statistical procedure known in the field of machine learning, which uses an orthogonal transformation to convert a set of observations of possibly correlated variables into a set of values of linearly uncorrelated variables called principal components.

Figure 2:
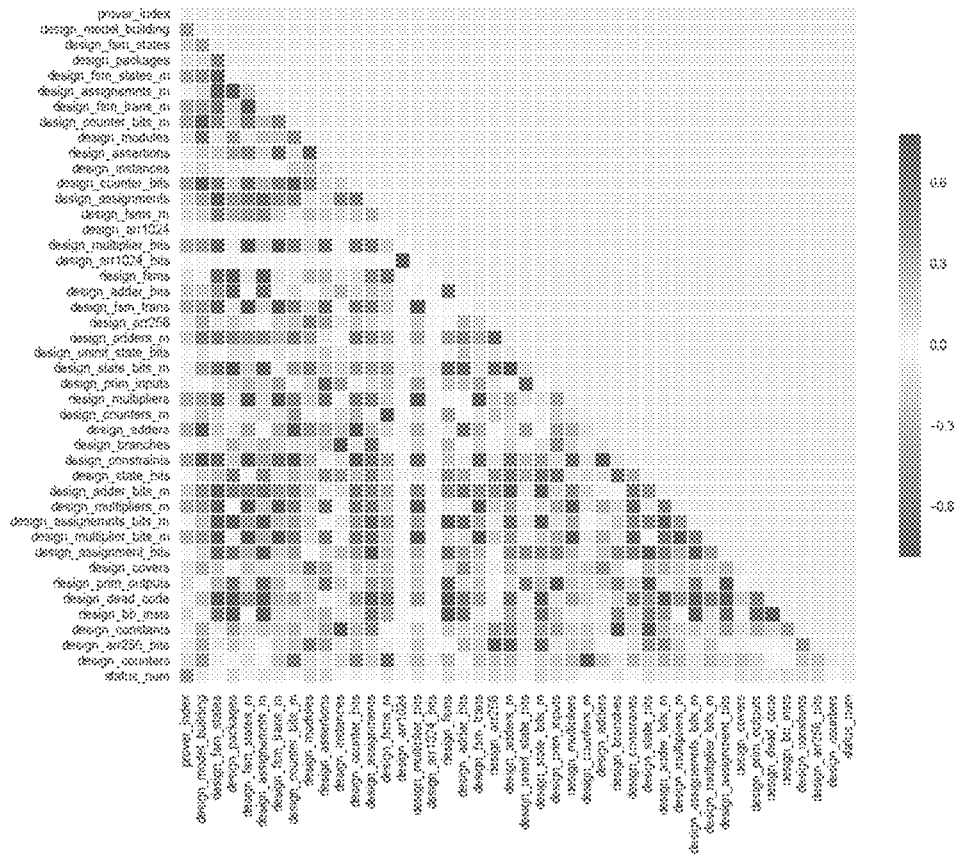
FIG. 2 shows a correlation plot of design parameter in accordance with a preferred embodiment of the present invention.

The present invention recognizes that the design parameters DP, i.e. the machine learning features, are strongly correlated, as can been seen on FIG. 2 showing a matrix of correlation between each pair of parameters DP of the set of parameters P (42 parameters in the example), as a heatmap with blue for maximum positive correlation and red for minim negative correlation in the example of the present application.

The present invention recognizes that PCA may be used to transform the machine learning space into an orthogonal reduced space, to remove cross correlation between the features. PCA is provided to derive out of the set of features values a set of linearly independent components—called principal components—which can then be used to reconstruct the initial set of features values. The PCA module 54 is adapted to transform and reduce the set of features F including the set of design parameters DP to a set of orthogonal components which contain a high percentage of the variance of the reconstructed input space, from the PCA components.

If a subset of the PCA components is used only a subset of the variability of the initial components is reconstructed. The PCA module 54 is therefore adapted to select only the main PCA components, i.e. the ones which ensure most of the variability of the initial components is preserved. When the optimal orthogonal transformation of the set of features has been found, only the Principal Analysis Components (PCA) which preserve most of the response variation are selected. In other words, the transformer module 50 with its PCA module 54 can be seen as a dimensionality reduction module.

Figure 3:
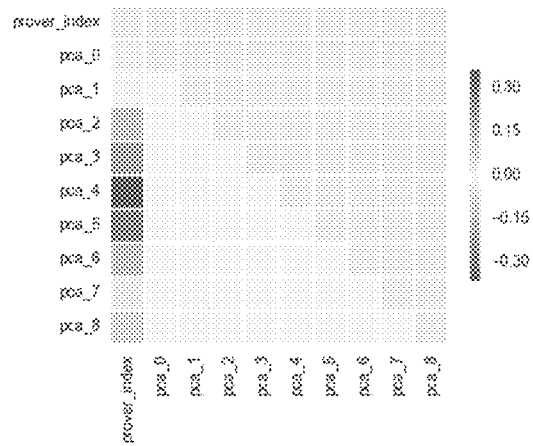
FIG. 3 shows a correlation plot of transformed features in accordance with a preferred embodiment of the present invention.

FIG. 3 shows the results of the PCA transformation in the example of the present specification. The matrix of correlation between each pair of parameters P of the set of parameters DP (42 parameters in the example) is drawn as a heatmap with blue for maximum positive correlation and red for minim negative correlation, but on the transformed features after PCA has been applied. In the example of FIG. 3, a total of 9 PCA components are kept, all the rest having an insignificant ratio of explained variance in the total. The PCA module 54 has removed the cross-correlation. As can be seen from the comparison of the matrix of FIG. 3 in comparison with the matrix of FIG. 2. In other words, without this step of PCA, strongly correlated parameters would not be distinguishable, and the final model would have randomly chosen parameters out of cross correlated sets. It should be noted that the number of PCA components which are used is given as an example only and is not limiting the invention. PCA is a requirement for the next step of building and fitting the pipeline.

After the transformation of features is complete, the classification module 60 is used to predict the best prover(s) BP, as the winning prover(s), among the set of provers P for each property (step S4).

Classification as known in the art is concerned with building classification models that separate data into distinct classes. Applied to the present application, the target class is the winning prover i.e. the prover of the set of provers P which solves the property faster than the other provers of the set of provers. A classification model CM run by the classification module 60 is built by inputting a set of training data. In the present application the training data are the runtimes of the property checks and the corresponding machine learning features.

It will be understood that the classification model can be used by inputting a different dataset for which the classes are withheld, allowing the classification model to predict their class membership based on what it has learned from the training set. In the present application, the different data set are new properties.

A multiclass One-vs-Rest logistic regression may be used to predict probabilities of each prover of the set of provers P to solve a given property faster than the others, given the transformed features. The classification module 60 is able to predict not only the winning prover, but also calibrated probabilities per prover, i.e. chances of the provers to win.

Figure 4A:
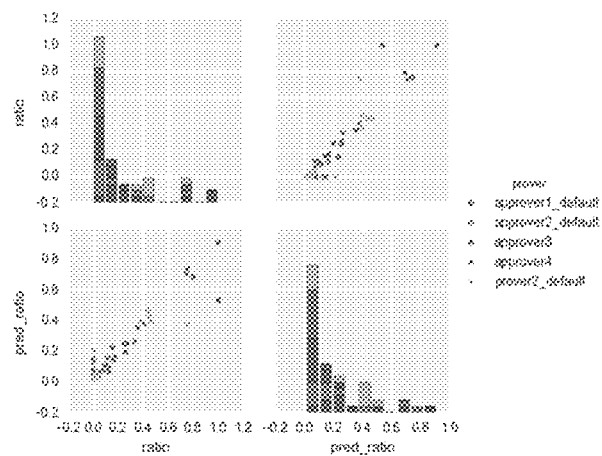
FIG. 4A is an example scatter plot of predicted probability versus real ratio with a classifier according to an embodiment of the present invention.

It should be noted that using multi-class logistic regression classifiers on a set of features has more advantages. First, the probability of each prover class to win can be predicted, and not only label it as winner or not. This allows ranking the provers, and choosing more to run e.g. the ones whose predicted probability exceeds a threshold. Further, it allows to model even with missing features, if the most important ones are taken into consideration: if ideally all features are known, then each property has one winning prover with probability 1, and the rest 0. If there are features missing, for a set of properties with features that can be measured having identical values (but in reality distinct features we could not measure), the classifier will predict a set of winning provers, with different probabilities, so that for all the properties, a set of provers can be selected which ranks higher—and each property in the set will be solved fast by one of the selected provers. Another advantage is that, to validate the classifier, a natural comparison is obtained between the ratio of properties solved by each prover, and its predicted probability—for each set of properties with identical features. The closer the probability to the ratio, the better the classifier. An example scatter plot of predicted probability versus real ratio is showed in FIG. 4A, where only a subset of features are used. Each point corresponds to a design-prover combination, and is assigned a probability. The predicted probability and real ratio are close to each other and the ranking of the top 2 provers per design is correct (can predict for each design their top 2 winning provers).

Figure 4B:
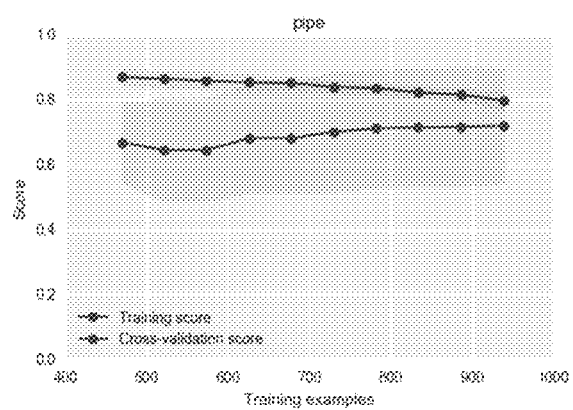
FIG. 4B is a performance plot of training a classifier in accordance with a preferred embodiment of the present invention.

Several scores may quantify the performance of the classification module 60, among others accuracy, Receiver Operating Characteristic curve, Confusion matrix The classification model CM may be validated using classification accuracy, at step S5. Accuracy is the number of correct predictions made divided by the total number of predictions made. The classification accuracy with different sample sizes is shown in FIG. 4B which shows a performance plot of training a classifier in accordance with a preferred embodiment of the present invention.

Confusion matrix is another tool to help quantifying the performance of a prover. Each column of the confusion matrix represents the instances in a predicted class, while each row of the confusion matrix represents the instances in an actual class.

Figure 5:
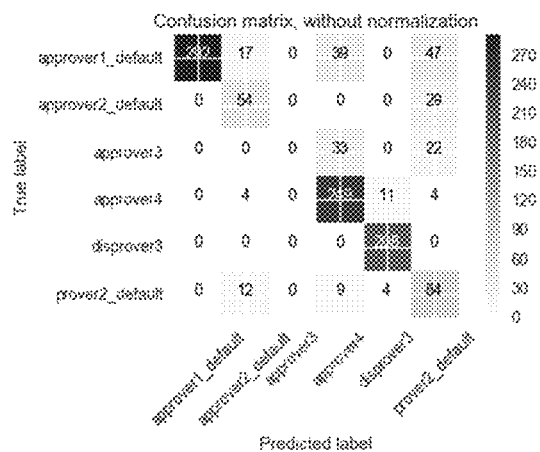
FIG. 5 shows a confusion matrix in accordance with a preferred embodiment of the present invention.

An example of confusion matrix is shown on FIG. 5, with the predicted number of labeled samples versus the real number of labeled samples, for each prover pair. In case one winning prover is selected per property, the confusion matrix plot shows the number of correctly classified versus misclassified properties. As can be seen in the example of FIG. 5, approver 3 is misclassified, while disprover3 completely correctly classified. This misclassification happens because approver 3 is not the winning prover for most properties of any design, but is the winning prover for some properties.

To avoid this effect of misclassification, the classification module 60 may be used to predict the probabilities of all provers, and more provers are selected per design. Comparing the predicted probabilities to the real ratio of each prover per design and property result yields good results: less than 10% have an absolute difference of 0.1 and no case above 0.3. The coverage score indicates how many provers to select to cover all winning provers per property can be used.]

Figure 6:
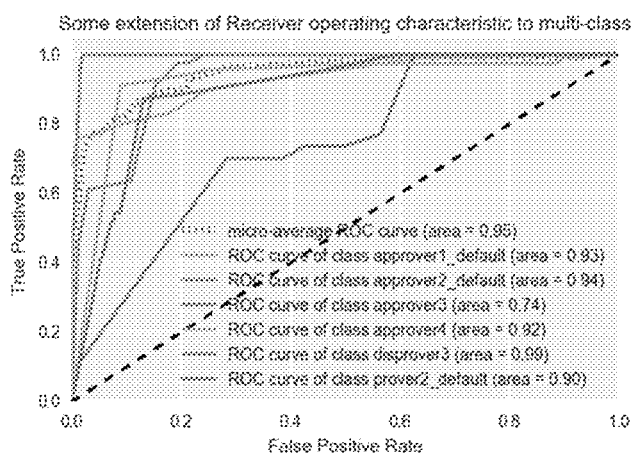
FIG. 6 shows a multiclass receiver operating characteristic plot in accordance with a preferred embodiment of the present invention.

Receiver Operating Characteristic (ROC) is another score to quantify the performance of the classification module 60. ROC curves have true positive rate on the Y axis, and false positive rate on the X axis. This means that the top left corner of a ROC curve is the "ideal" point—a false positive rate of zero, and a true positive rate of one. Having a larger area under the curve (AUC) is better. FIG. 6 shows a ROC curve in the example of the present application. As can be seen on FIG. 6, the ROC curve also indicates acceptable AUC, despite Approver 3 classifier's poor performance.

The validation may also be done on designs not used for training, which also reach a score above 90% if one design is left for validation. The validation design parameters should be within the range of the parameters of the training designs.

It should be noted that other classifiers may be used, such as K Nearest Neighbors Classifier or Random forest Classifiers. K Nearest Neighbors Classifier is simple to implement, with the advantage of not making assumptions of linear behavior of solve probability on the transformed feature space. However, K Nearest Neighbors Classifier has the risk of not-scaling when the dataset is too big. On the other hand, Random Forest Classifier might be overfit, whilst being easily exported to productive use. Of course, it may be possible to combine more classifiers, to get a better prediction.

When known effects of features can play a role (exponential, interactions, polynomial), additional transformers can be included in the pipeline The skilled person will understand that the present application uses multi-class logistic regression to assign probabilities to different provers proportional to the chances to solve properties of a specific design, whereas the prior art proposed to use regression based on the runtime, but this is more difficult to estimate, and is not needed because optimal prover selection is a classification problem.

It should be noted that a diagnosis of the classification model CM can be implemented. If the classifier or repressor is not accurate enough, then the estimators' fit, the data preparation or the collect data steps have to be revisited. More specifically, when the test score is poor compared to the train score, the model is probably overfit, which can happen when the training data is not sufficient (the feature space must have a bigger coverage), or the chosen model was too complex. The second cause is unlikely, since a logistic regression model is used with only linear dependencies features-class probability. When both test and train scores are poor, there may be features which play a role but were not taken into account. The unaccounted features can be known but unusable during model deployment e.g. because they are too expensive, or unknown. The 2nd case can also be diagnosed by isolating cases where the winning prover varies even when none of the known features vary. An idea to overcome this is to add new "features" as the outputs of provers while being run (by step size or BCP count), which is a potentially usable feature during dynamic deployment of the model.

The pipeline can be optimized by a search e.g. grid, on the complete parameter space of the operators involved, e.g. optimization of the classification accuracy vs. the regularization of the linear regression.

The present invention is concerned with configuring the provers, in particular for setting a threshold to limit the maximum number of steps the prover runs, before the prover will be interrupted. Such a configuration is needed because the time cannot be used directly as a limit and a step size is needed, because different machines have different runtimes. Different machines must use a limiting parameter constant among all machines—which is the prover's internal counter—step size or BCP counter.

Therefore, a prover configuration (or prover parameter setting) is needed to interrupt the provers when they reach the configured step size for a property, with the disadvantage that no meaningful result is reached for that property, but with the advantage that subsequent properties can be reached and provers don't spend too much time on this particular property. A constant step size for all designs is not good because it will be reached fast for some designs, with no meaningful result for many properties, and no big gain in time, while a large step size will determine a lot of time invested for some designs. Therefore a step size depending on the design features must be set.

The present invention proposes a regression module 64, which is provided to model the dependency of the step size on the design parameters (features) and expected time to check the assertion. This is done by the regression module 64, at step S6 of the method for building the pipeline. A prediction is made by setting an expected runtime (on the reference machine) and specifying the design features values, as inputs, and getting the corresponding step size for a particular prover as output.

The regression module 64 is adapted to run a regression model RM to optimally predict the step size in order to limit the time spent per check (property). As will become clear from the description, using the regression model RM with linear regression for configuring the provers P allow avoiding the drawbacks of the prior art approaches which proposed to add multiple instances of the same prover with different settings and compare them to select the best setting. This prior art approach is not efficient for continuous setting.

Ordinary Least Squares Linear Regression is an approach for modeling the relationship between a scalar dependent variable, one or more explanatory variables (or independent variables). The Ordinary Least Squares Linear Regression fits a linear model with coefficients to minimize the residual sum of squares between the observed responses in the dataset, and the responses predicted by the linear approximation. Because the present invention is concerned with the configuration of the provers, the dependent variables of the linear regression may be the number of steps, and the independent variables of the linear regression may be design statistics and expected check time.

Figure 7:
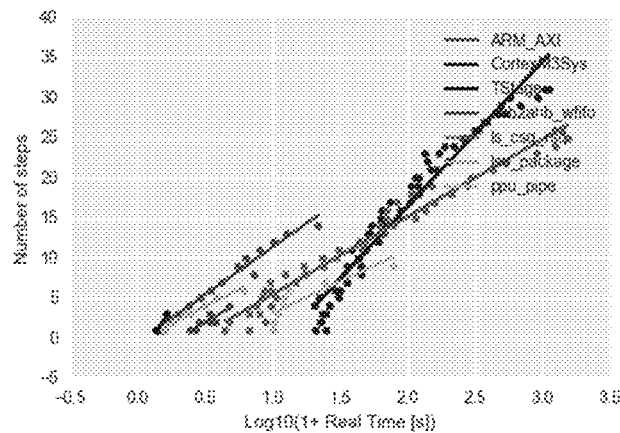
FIG. 7 shows the number of steps for different designs in accordance with a preferred embodiment of the present invention.

FIG. 7 shows the result of a linear regression done by the regression module 64 for two provers, namely disprover1 and disprover 3. More precisely, FIG. 7 shows the linearized step on log 10(1+Real Time) with different colors for different designs, the data being measured on the prover Disprover1 for designs where step size is bigger than 1, and runtime is bigger than 10 s. At least for the two provers disprover1 and disprover 3, there is an approximately exponential dependency of the time for the check to converge on the required number of steps. The modelling is split in fitting a linear function F so that Steps=F(log 10(1+Real Time)). The resulting coefficients for different designs are fitted as linear regression models on the transformed features.

The regression of linear coefficients as shown on FIG. 7 was done using a Least Angle Regression LASSO model. Least absolute shrinkage and selection operator (LASSO) is a linear model that estimates sparse coefficients. LASSO is useful due to its tendency to prefer solutions with fewer parameter values, effectively reducing the number of variables upon which the given solution is dependent, Least Angle Regression LASSO is the model selection algorithm which less greedy than traditional forward selection methods. In the present embodiment, a LASSO model is of interest for the following reasons. There are as many samples as the number of designs. Because PCA was first applied, as explained above, the correlation of features was removed. Therefore the problem of randomly chosen features does not appear here in the model. This problem of randomly chosen features could otherwise happen with LASSO whenever PCA has not been applied before. It is noted that there are other linear regression models that could be applied, such as the Nearest Neighbor Regressor which is an alternative model, with comparable performance.

The regression model RM is validated at step S7. The regression module may be validated using maximum or average absolute error on step size prediction.

Figure 8:
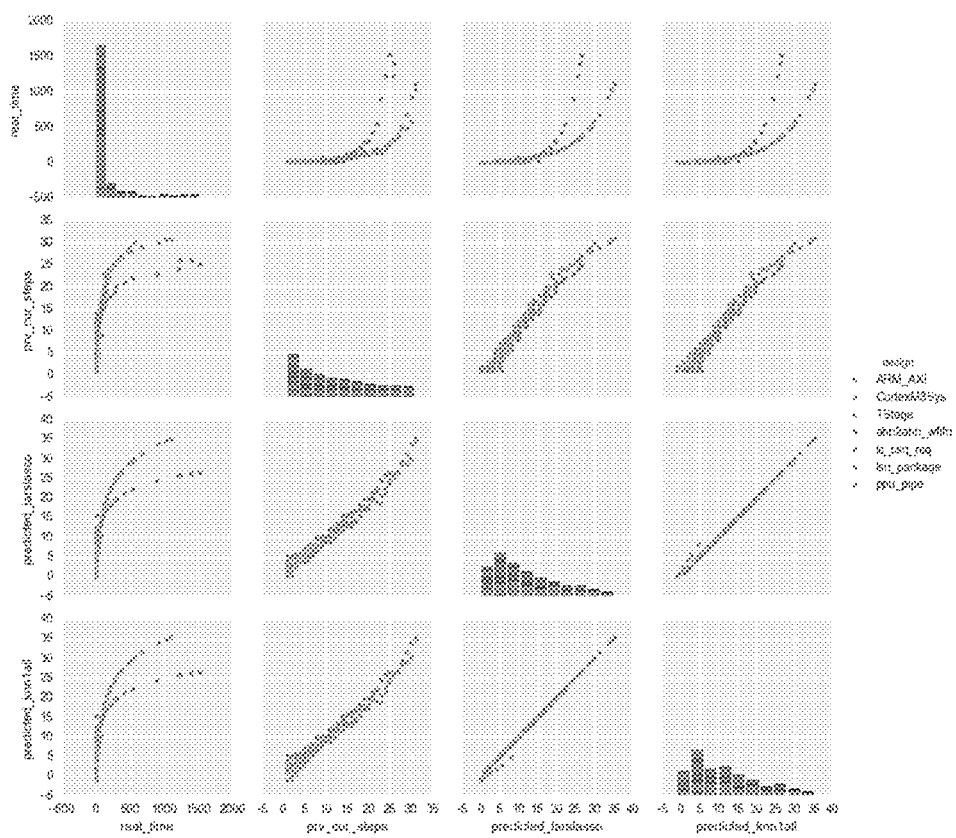
FIG. 8 shows comparative data between real time, predicted numbers of steps and numbers of steps in accordance with a preferred embodiment of the present invention.
Figure 9A:
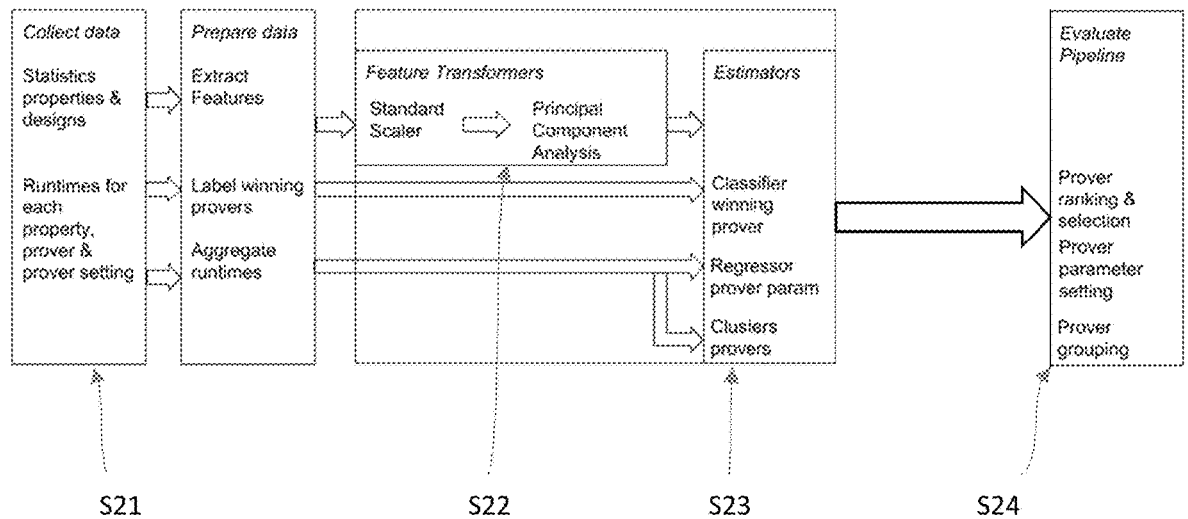
FIG. 9A is a diagram illustrating a method for selecting a prover.
Figure 9B:
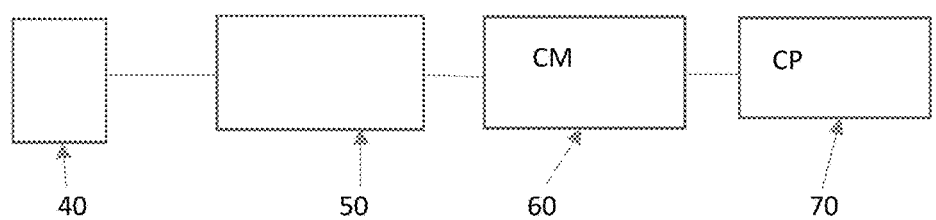
FIG. 9B is an overview of a system for selecting a prover in accordance with a preferred embodiment of the present invention.

The step size prediction versus the actual step size can be seen on FIG. 8 showing a pair plot. This type of plot shows scatter plots of each dimension against each other (real time, number of steps and prediction on the number of steps in the present application), and histograms of the data on the main diagonal, colored by the design in the present application. One design is left for validation ('lsu_package'). The pair plot shows an approximately linear dependency and equal range between the actual (prv_cur_steps) and predicted number of steps predicted_larslasso, as well as predicted_knn1all, therefore indicate the prediction follows the real value, quantified by the correlation coefficient: 94% for Lasso and 95% for Nearest Neighbor Regressor.

The maximum absolute error on the coefficients of the estimated dependency is for the designs used for train, less than 0.15 and 6 for the test design. This translates in a maximum error of predicted step size of less than 5, both on training and validation. The validation design has a much higher error of the linear coefficients than the training designs. This indicates an overfit. The nearest neighbor regressor can be added to increase the confidence on prediction.

Once the pipeline has been built and validated, the pipeline may be used in a method for verifying a design under test, i.e. for new properties and designs, to determine which prover(s) should be used for the verification of the design under test, and optionally define a test scheduling. Optionally, new batches of data can be collected from new designs, to refine the pipeline, e.g. by partial fits, using Stochastic Gradient Descent.

The method comprises a first step of collecting data (S21). The data module 40 can collect and prepare data to be injected in the pipeline. The data design parameters DP of the designs under test to be used as features F.

The expected result of the property (hold/fail) may be used to separate the data before using the pipeline.

The features F outputted from the data module 40 are then used by the validated pipeline to classify the prover, as a winning prover or not. It should be understood that the prediction of the step size is realized after selecting the best prover and before running the prover. This is useful to schedule more properties to be verified sequentially, and predict the step size which corresponds to a long time duration (on the reference machine).

The prediction functions can be exported to productive use because the prediction consists of feature transformations and linear functions.

The prediction functions are done by the transformer module 50 and the classification module 60. As explained above with reference to FIGS. 1A and 1B, the transformer module 50 is adapted to transform the features and apply linear functions (step S22), to standardize each feature from the set of features F to a unit variance. This is done by the standard scaler module 52 and the principal Component Analysis module 54, adapted to apply PCA to the set of design parameters DP.

PCA may be used to transform the machine learning space into an orthogonal reduced space, to remove cross correlation between the features. The PCA module 54 is adapted to transform and reduce the set of features F including the set of design parameters DP to a set of orthogonal components which contain a high percentage of the variance of the output. When the optimal orthogonal transformation of the set of features has been found, only the Principal Analysis Components (PCA) which preserve most of the variance of the reconstructed input space are selected. In other words, the transformer module 50 with its PCA module 54 can be seen as a dimensionality reduction module.

The classification module 60 is used to predict the best prover(s) BP as the winning prover WP among the set of provers P for each property (step S23). The classification model CM is run by the classification module 60 by inputting the new properties of the design under test for which the classes are withheld, allowing the classification model to predict their class membership based on what it has learned from the training set.

A multiclass One-vs-Rest logistic regression may be used to predict probabilities of each prover of the set of provers P to solve a given property faster than the others, given the transformed features. The classification module 60 is able to predict not only the winning prover, but also calibrated probabilities per prover, i.e. chances of the provers to win.

Based on the classification of the provers obtained by the classification module 60, a prover clustering module 70 may provide clustering capabilities (step S24). Clustering is the task of grouping a set of objects in such a way that objects in the same group (called a cluster) are more similar to each other than to those in other groups (clusters). In the present invention, Clustering is the task of grouping a set of provers in such a way that provers in the same cluster are more similar, based on runtimes with different properties in our case, to each other than to the provers belonging to other clusters. Clustering can also be applied on properties, to group them based on similar runtimes with different provers.

The prover clustering module 70 can group provers based on similarity of the runtimes on different checks when more provers can be run in parallel.

The prover clustering module 66 can parallelize the provers by selecting provers from different clusters. Clusters indicates which groups of provers are orthogonal in their behavior on sets of checks/designs. If the checks are sufficiently different, the checks will require different prover groups for minimal runtime, therefore running prover groups in parallel can minimize the runtime for the overall set of checks.

With other words, the present invention proposes using clustering for prover scheduling, by grouping provers based on runtime similarity and choosing provers from different groups to optimize the runtime on sets of checks. FIG. 10 shows a method for selecting provers to run in parallel according to the present invention.

In a first step S31, the prover clustering module 70 gets the runtime for each property and each prover. The result of this step can be seen on FIG. 11, which shows a plot of heatmap runtimes checks for different provers.

The heatmap shows by the color gradient the runtimes for a simple example with 120 checks and 6 provers. The number of checks and number of provers are for illustrative purpose only. The timeouts may be replaced by higher runtime values. In the example of FIG. 11, the timeouts were replaced by double the maximum runtime (seen by dark gradient).

The provers and checks are grouped together into prover clusters and property clusters in the next steps. To do so, cluster properties are grouped in a limited number n of clusters at step S32, and the provers are clustered in a defined number m of prover clusters m. The defined numbers of prover clusters represents the maximum number of a user would like to urn in parallel.

The results can be seen on FIG. 12 showing dendrogram of clusters of provers and on FIG. 13 showing dendogram of clusters of properties. A dendrogram is a tree like diagram of the distances between clusters with iteratively merged clusters from bottom—where each sample is one cluster, upwards. The dendrogram assists in selecting an optimal number of clusters. The optimal number of clusters can be identified by deciding a cut-off point in the dendrogram. This is applied separately on the properties which hold and on properties which fail.

Once the clusters have been created, the prover clustering module 70 is adapted to assign a prover cluster for each property cluster (step S34). The prover cluster assigned to a property cluster corresponds to the prover cluster among the m prover clusters having no time out and/or a minimum sum of runtimes.

Hence, the skilled person will understand that this method of assigning a prover cluster to a property cluster instead of to a single property is faster. Indeed, the clustering based approach avoids the calculation, for each combination of m provers, of the minimum runtime of the current combination for the property, for each property, and then sum up the minimum runtimes of all the properties.

Finally, for each prover cluster, the best prover from the cluster may be selected, as being the one having the minimum sum of runtime over all properties of the property cluster.

The result can be seen on FIG. 14 shows a table of sum run times per pair of properties cluster and provers cluster. More precisely, the table of FIG. 14 contains the sum of runtimes for the selected best prover in each prover cluster, and for each cluster of properties. NA indicates there are timeouts in the respective cluster. The runtimes of the chosen clusters are marked yellow. There can be seen clusters of properties where: all clusters of provers converge, and the one with the shortest sum of runtimes is chosen, 2 clusters of provers converge, and the one with the shortest sum of runtimes is chosen, and only one cluster of provers converges, which is chosen as the only option.

In the example described with reference to FIGS. 10-14, the skilled person understands that the combination of cluster 1 and cluster 3 may be chosen, and in said cluster, the provers 2:12 in cluster 1 and the approver 4 in cluster 3 may be selected as being the best provers to run in parallel. In this example, the best provers are chosen as being the ones with the smallest overall runtime.

The clustering can be validated by ensuring a big enough distance between clusters.

Agglomerative hierarchical clustering based on the similarity between runtimes of different provers on different checks was applied to group both provers and checks. A linkage matrix with pairwise distances between points, according to a chosen linkage metric is first calculated. The second step is an iterative clustering which maximizes the distance between clusters.

It should be noted that the linkage metric defines how to calculate the distance between newly formed clusters depending on the coordinates of the points in the clusters. The linkage can affect the resulting clusters. To identify the best linkage metric, clustering can be performed using all available metrics, and the results can be compared, in terms of cophenetic correlation and how provers known to be similar on a known set of properties are clustered together. The cophenetic correlation is a measure of how faithfully a dendrogram preserves the pairwise distances between the original unmodeled data points. In the example of the present invention, the linkage metric which maximized the cophenetic correlation and grouped known similar provers together and different provers apart, was ward variance minimization algorithm, which is defined here [https://docs.scipy.org/doc/scipy-0.14.0/reference/generated/
scipy.cluster.hierarchy.linkage.html#scipy.cluster.hierarchy.linkage The dendrograms of the runtimes of 841 holding properties and 179 failing properties are shown in FIGS. 15 and 16. Different clusters are colored using a default cut-off level of 70% from maximum intra-cluster distance. As can be seen on FIG. 15, the grouping is according to expectations, similar strategies of prover 2 e.g. strategies 0-8 vs. Strategies 9-15 falling in different clusters if choosing a cut-off intra-cluster distance of e.g. 2000, and approvers 3 and 4 having as well enough differences to fall in different clusters. A different clustering is obtained for failing assertions, as seen on FIG. 16.

Figure 17:
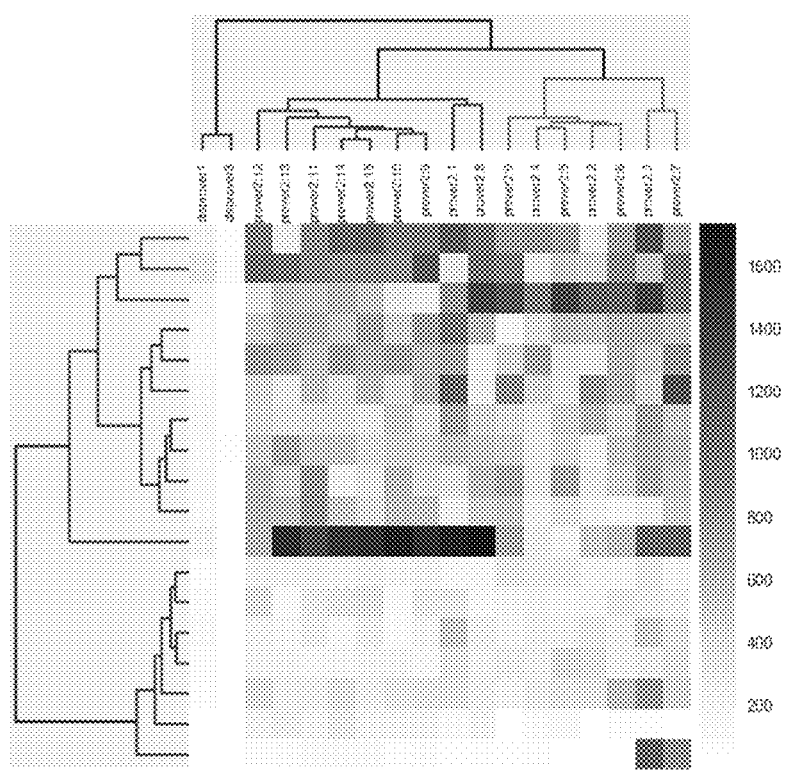
FIG. 17 shows a heat map and dendrograms of clustered provers for clustered properties in accordance with a preferred embodiment of the present invention.

Finally, FIG. 17 shows how a similar clustering can be made on the properties, visible by the dendrogram on the left, the dendrogram on top is the prover clustering from FIG. 10, while the center plots the heatmap of the runtimes, where the rows and columns are reordered as the dendrograms indicate. A reduced set of properties is shown (properties taking longer than 5 minutes).

A pattern is visible which indicates that prover clusters behave similarly for property clusters, consequently best and worst prover clusters for properties in the same cluster are shared. This can be applied for scheduling by selecting provers to run in parallel from clusters which perform optimally for the clusters of properties under study.

It should be noted that in order to cluster the provers and the properties, the runtime is needed for each prover and property combination. But sometimes data is missing and clustering must find a way to work with it. In no case should the data be replaced by 0, because this would consider the prover a fast solver for the property. Also removing the properties where some provers time out is not recommended, because it risks removing exactly the representative properties which were too slow on some provers, but fast enough on some others.

The missing data should be treated differently depending why the data is missing. If the data is missing because the prover was not recorded, then the observations could be removed completely to avoid assuming which would be the prover behaviour. Another solution comprises initializing the missing values to the columns' means, then repeating until convergence: 1) clustering the filled-in data, and 2) assigning to the missing values the centroid coordinates of the clusters to which they were assigned. Yet another solution would be to assign the average coordinate values of the nearest neighbours in the other dimensions. If the data is missing because the prover timed out, then there are more options: A solution consists in filling in the missing data with fixed values, higher than the time limit used, but not too high, e.g. 1.5*time limit. In this way, the missing values would determine provers with many missing values to be far from the ones without, but would avoid distancing the provers with different amounts of missing values too much from each other. The resulting clusters can be validated by comparing against clusters with varying value used for missing values (e.g. in the range time limit . . . double the time limit).

It should be noted that using the prover clusters as a target class for the prover selection classifier, instead of the actual provers, can improve the quality of the prover selection because it reduces the provers to groups with significant differences, therefore easier to be separated by a classifier.

The checks can also be clustered by similarity on runtimes with different provers. This can be more efficiently performed on the features after the PCA transformation. This can be extended by training a classifier to predict for new checks the corresponding cluster, and therefore the best prover.

For an efficient online use, a feature ranking realized by some types of classifiers e.g. Random Forests, shows which features are most important to be evaluated first, and to check if the decision of the model is already confident enough.

Scheduling of the provers in parallel can be done by clustering and selecting provers from alternative clusters. Alternatively to clustering the runtimes and choosing provers from alternative clusters, the scheduling of which provers to run in parallel can minimize the number of timeouts for a given time limit, and candidate groups which have the same number of timeouts are afterwards sorted by probability to solve within a time limit. In a further aspect, the provers can be scheduled sequentially. The scheduling can define provers from clusters which are fast on some types of checks (properties) first, with a parameter setting corresponding to a small time limit, allowing subsequent groups to be reached, and clusters with generally higher runtimes afterwards.

In summary, the present invention provides a user with a portfolio of provers based on the actual design and verification task at hand that maximizes the chance of success while staying within resource bounds. This approach eliminates the need for expert knowledge on the user side, greatly improving usability and resource requirements.

The innovation consists in embedding machine learning into a formal verification tool. A verification challenge (designs and properties) can be reduced to a set of characteristics or features sufficient to predict a verification engine capable to resolve the verification problem. Examples for such features may include Design Control Points such as design input, in-out ports, un-driven wires, and user-defined cut points, Design Structural Elements such as the total number of counters in the designs or the number of RAM blocks, Design State Complexity measuring the total number of design state elements, including the total number of design latches and flip-flops, Property Complexity comprising the sequential depth, a total number of flip flops, latches, and combinational gates of the property.

Further, the present invention provides machine learning algorithm capable to use these features to automatically schedule the verification engines with the goal of both maximizing their probability to converge and to minimize the resource usage such as runtime and memory consumption. This predictor can be trained by the extracted features and available user data. The automated scheduling includes the selection of a set of verification engine(s) to be run sequentially or concurrently, the selection of runtime parameters of verification engines, and resource limits (e.g. in terms of real time, steps in Bounded Model Checking, or Boolean constraint propagation counts in verification engines based on SAT).

Machine learning is used for optimal engine selection, and provides a tool that automatically detect a verification schedule specific to the verification challenge at hand.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein. It is also to be noted that individual aspects can be arbitrarily combined with each other.

What is claimed is:

1. A computer implemented method of selecting a schedule of one or more provers among a plurality of provers for a set of property checks to be resolved within a design of an electronic circuit under formal verification, comprising:
    injecting into a transformer module in a computing device a plurality of input features relating to design parameters;
    transforming, by said transformer module in said computing device, the plurality of input features, to obtain a plurality of transformed features, wherein transforming the plurality of input features comprises scaling and principal component analysis of the plurality of input features;
    classifying, using a classification module in said computing device, provers from the plurality of provers in which the classification module is adapted to predict a probability that a specific prover resolves a specific property check faster than the remaining provers of the plurality of provers using the transformed input features;
    modelling, by a regression module in said computing device, a dependency of a step size on the design parameters and expected time to check the assertion, and
    selecting one or more prover schedule based on the results of the classification.

2. The method of claim 1, wherein the transforming of the plurality of input features comprises removing cross correlation of the input features.

3. The method of claim 2, wherein the step of removing the cross correlation of input features comprises:
    standardizing, by a standard scaler module, the input features of the plurality of features to a unit variance to standardized features; and
    applying, by a principal component analysis module in said computing device, an orthogonal transformation as a principal component analysis to the standardized features, and keeping the components resulting from the principal component analysis having a significant ratio of explained variance.

4. The method of claim 1, wherein the classification module is pre-trained by collecting a set of training data pertaining to a set of designs, design parameters and runtimes for a plurality of provers, transforming the set of training data, and classifying the provers using the transformed set of training data.

5. The method of claim 1, in which the classifying step comprises assigning, for a property, a probability to a prover using a multi class logistic regression based on design features and an expected result of the property.

6. The method of claim 1, further comprising configuring the provers of the plurality of provers using linear regression modeling dependency of a step size on the design and an expected time of the prover to check the assertion.

7. The method of claim 6, in which a prover is configured using a LASSO regression model having dependent variables and independent variables, in which the dependent variable of the regression model is a number of steps and the independent variable of the regression model are design statistics and expected check time.

8. The method of claim 1, further comprising grouping provers in a plurality of prover groups and grouping properties in a plurality of properties, based on runtimes for each property and prover.

9. The method of claim 8, further comprising assigning a prover group to a property group, in particular in which the assigned prover group of the plurality of prover groups has a minimum sum of runtimes.

10. The method of claim 9, further comprising selecting, for each assigned prover group, the prover of the prover group having the minimum runtimes over the properties of the property group to which the assigned prover group is assigned.

11. The method of claim 9, further comprising running the selected provers from the assigned prover groups in parallel.

12. A computer program product comprising a non-transitory computer medium having a computer program stored therein to cause a computer to perform the steps of a method according to claim 1.

* * * * *